(12) United States Patent
Kim et al.

(10) Patent No.: US 12,327,810 B2
(45) Date of Patent: Jun. 10, 2025

(54) DIE SURFACE TREATMENT APPARATUS AND DIE BONDING SYSTEM INCLUDING THE SAME

(71) Applicant: SEMES CO., LTD., Chungcheongnam-do (KR)

(72) Inventors: Min Young Kim, Gyeonggi-do (KR); Hang Lim Lee, Chungcheongnam-do (KR); Ji Hoon Park, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 412 days.

(21) Appl. No.: 17/726,487

(22) Filed: Apr. 21, 2022

(65) Prior Publication Data

US 2023/0343740 A1    Oct. 26, 2023

(51) Int. Cl.
*H01L 23/00*     (2006.01)
*H05H 1/24*      (2006.01)

(52) U.S. Cl.
CPC .............. *H01L 24/74* (2013.01); *H05H 1/24* (2013.01); *H01L 24/05* (2013.01); *H01L 24/80* (2013.01); *H01L 2224/05541* (2013.01); *H01L 2224/05647* (2013.01); *H01L 2224/80013* (2013.01); *H01L 2224/80395* (2013.01); *H05H 2245/40* (2021.05)

(58) Field of Classification Search
CPC ......... H01L 24/74; H01L 24/05; H01L 24/80; H01L 2224/05541; H01L 2224/05647; H01L 2224/80013; H01L 2224/80395; H05H 1/24; H05H 2245/40
See application file for complete search history.

(56) References Cited

U.S. PATENT DOCUMENTS

| | | | |
|---|---|---|---|
| 6,024,800 A | 2/2000 | Soejima et al. | |
| 9,196,460 B2 | 11/2015 | Hirayama et al. | |
| 9,711,406 B2 | 7/2017 | Martinez et al. | |

(Continued)

FOREIGN PATENT DOCUMENTS

| | | |
|---|---|---|
| CN | 102760633 | 9/2015 |
| JP | 2016-117092 | 6/2016 |

(Continued)

OTHER PUBLICATIONS

Machine Translation of Higure (JP2016117092A), 2016 (generated Jun. 10, 2024), Espacenet (Year: 2016).*

(Continued)

*Primary Examiner* — Andrew L Swanson
(74) *Attorney, Agent, or Firm* — WOMBLE BOND DICKINSON (US) LLP

(57) ABSTRACT

There are provided a die surface treatment apparatus capable of sequentially performing reduction and activation processes on dies in a dual zone and a die bonding system including the die surface treatment apparatus. The die surface treatment apparatus includes: a stage supporting dies, a first plasma generator installed on a moving path of the dies, the first plasma generator performing a reduction process on surfaces of the dies, in a first plasma area; and a second plasma generator installed on the moving path of the dies, the second plasma generator performing a hydrophilization process on the surfaces of the dies, in a second plasma area.

18 Claims, 11 Drawing Sheets

(56) References Cited

U.S. PATENT DOCUMENTS

| | | | |
|---|---|---|---|
| 11,600,593 B2 | 3/2023 | Lee et al. | |
| 2006/0048893 A1* | 3/2006 | Selwyn | H01L 21/31138 156/345.43 |
| 2006/0237398 A1* | 10/2006 | Dougherty | H05H 1/46 219/121.43 |
| 2007/0059127 A1 | 3/2007 | Guo et al. | |

FOREIGN PATENT DOCUMENTS

| | | | | |
|---|---|---|---|---|
| JP | 2016117092 A | * | 6/2016 | |
| KR | 1998-0070132 | | 10/1998 | |
| KR | 10-2004-0066301 | | 7/2004 | |
| KR | 20060128303 A | * | 12/2006 | H01J 37/32091 |
| KR | 10-2007-0016968 | | 2/2007 | |
| KR | 10-2015-0065518 | | 6/2015 | |
| KR | 10-1761256 | | 8/2017 | |
| KR | 10-1933318 | | 12/2018 | |
| KR | 10-2103811 | | 4/2020 | |
| KR | 10-2020-0045579 | | 5/2020 | |

OTHER PUBLICATIONS

Machine Translation of Choi (KR20060128303A), 2006 (generated Dec. 4, 2024), Espacenet (Year: 2006).*

Notice of Allowance dated Jun. 28, 2023 for Korean Patent Application No. 10-2020-0133181 and its English translation by Google Translate.

Office Action dated Jan. 18, 2023 for Korean Patent Application No. 10-2020-0133181 and its English translation by Google Translate.

Office Action dated May 24, 2023 for Taiwanese Patent Application No. 111110160 and its English machine translation by Google Translate.

* cited by examiner

[FIG. 1]
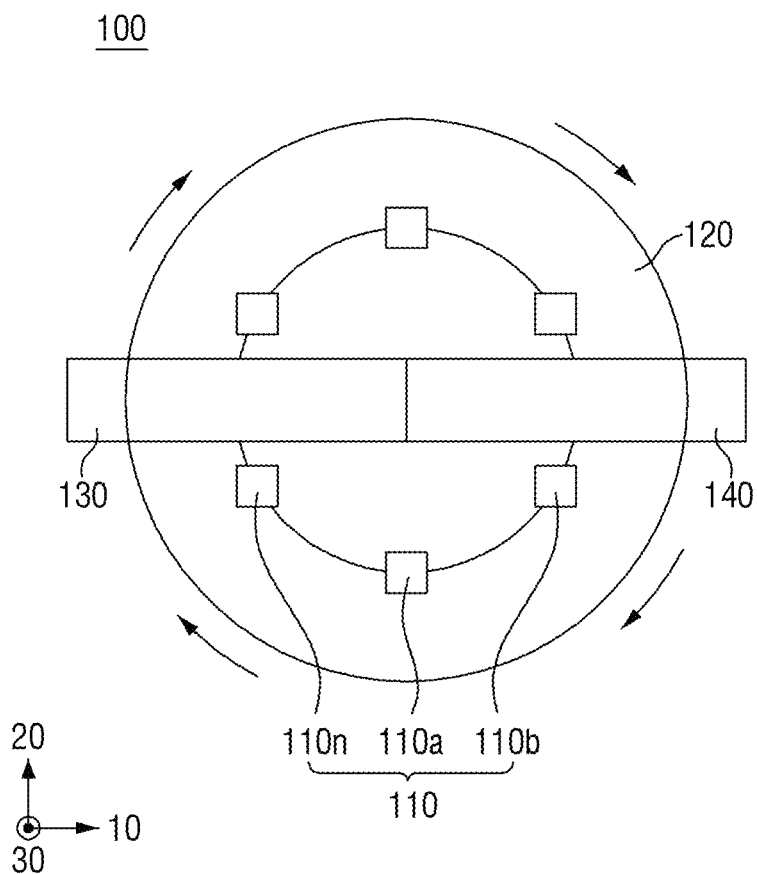
[FIG. 2]
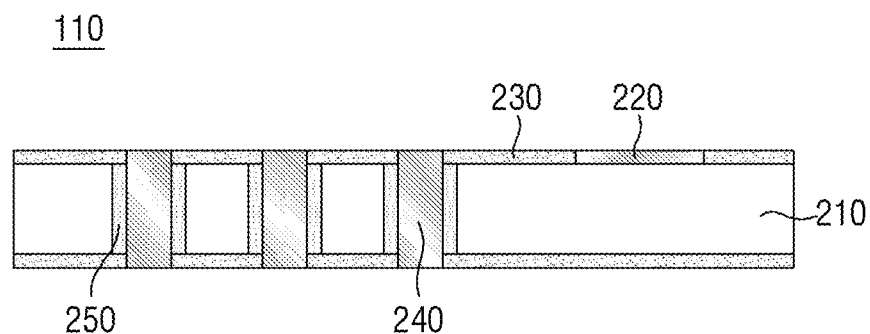

[FIG. 3]
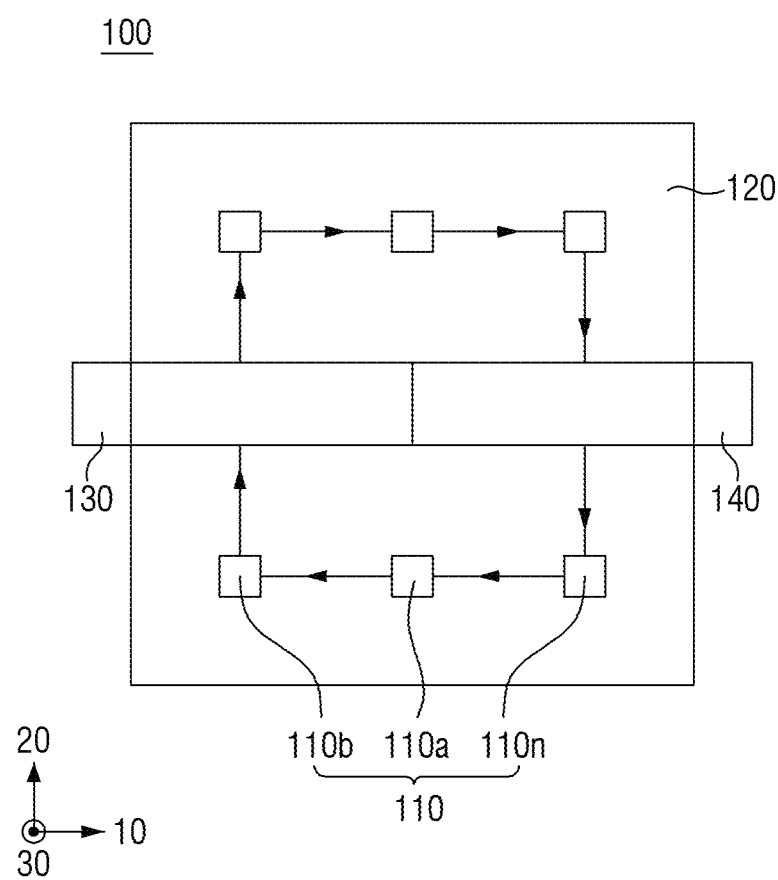

[FIG. 4]
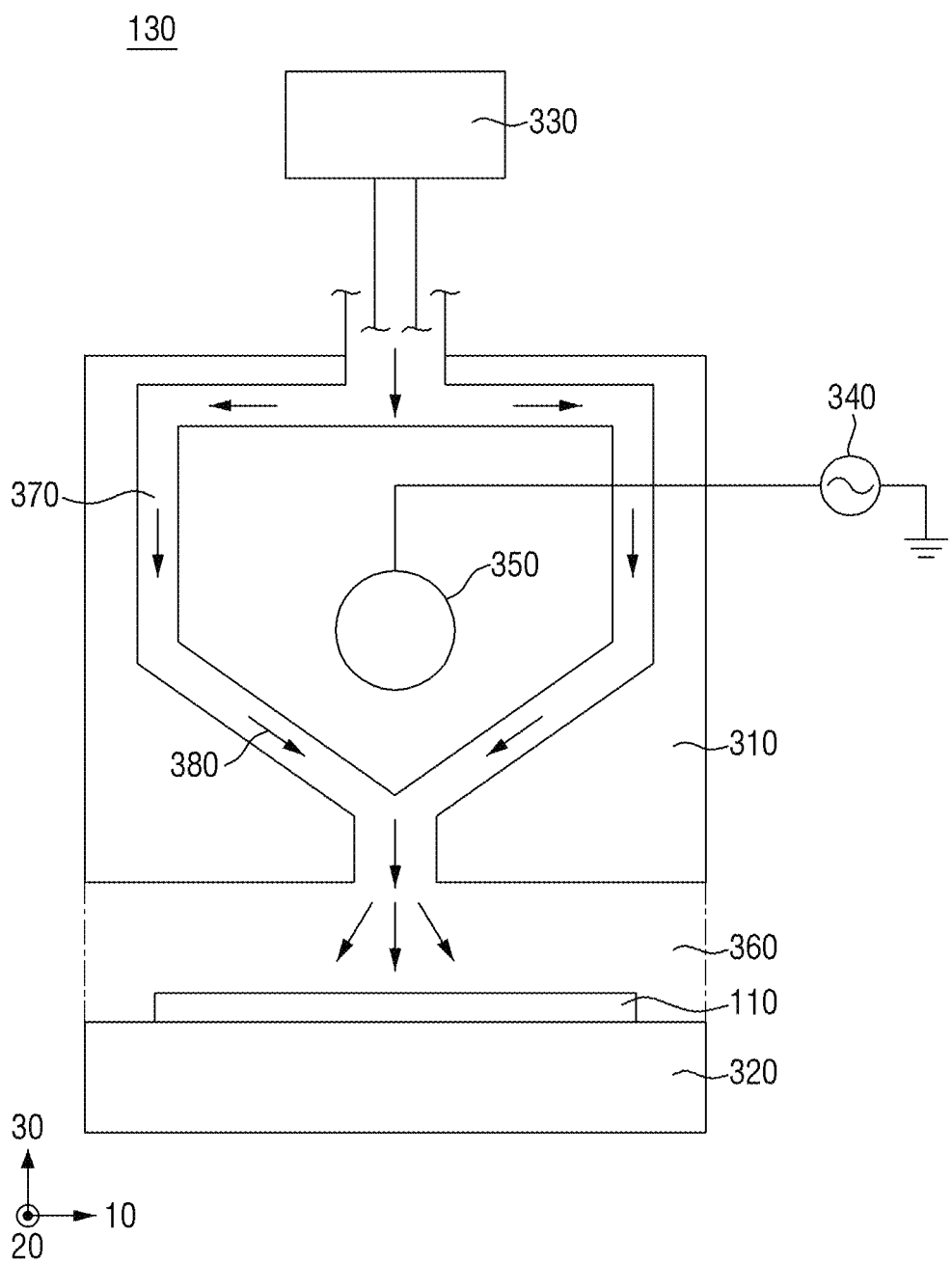

[FIG. 5]
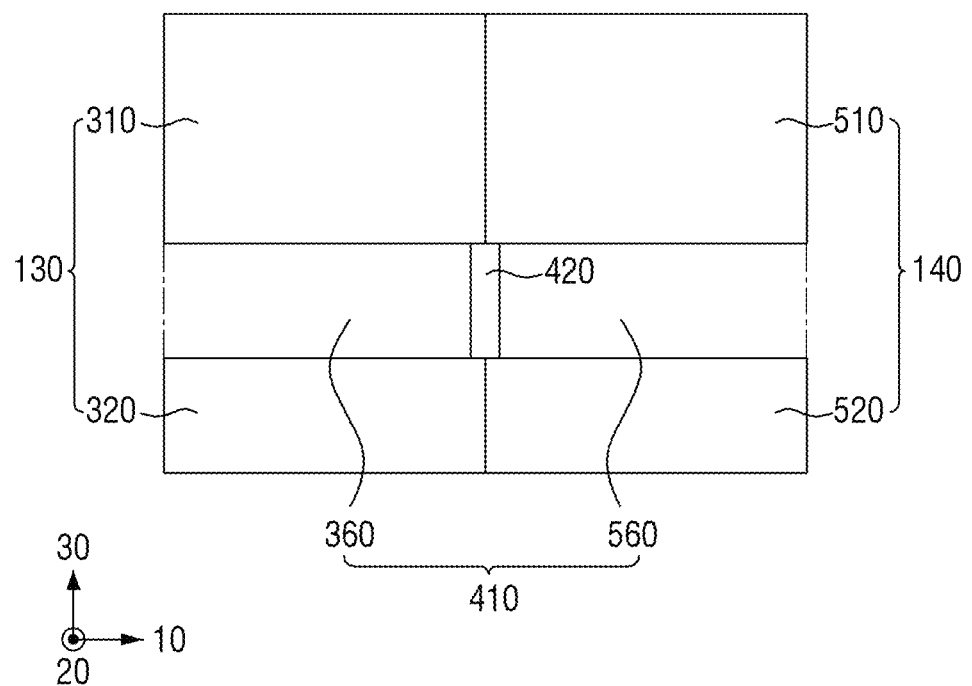

[FIG. 6]
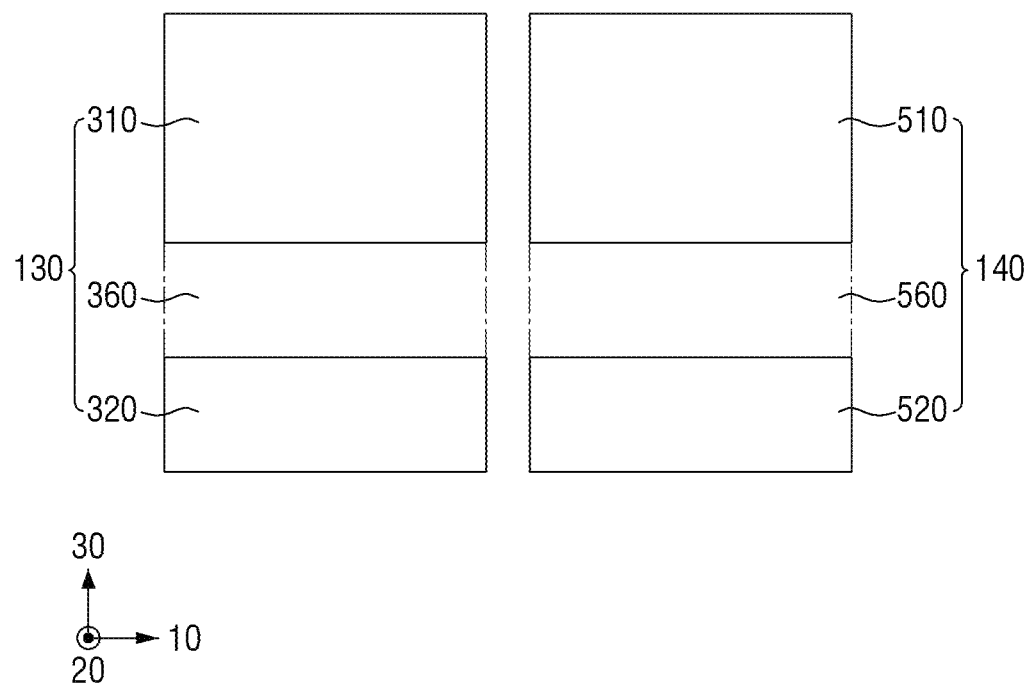

[FIG. 7]
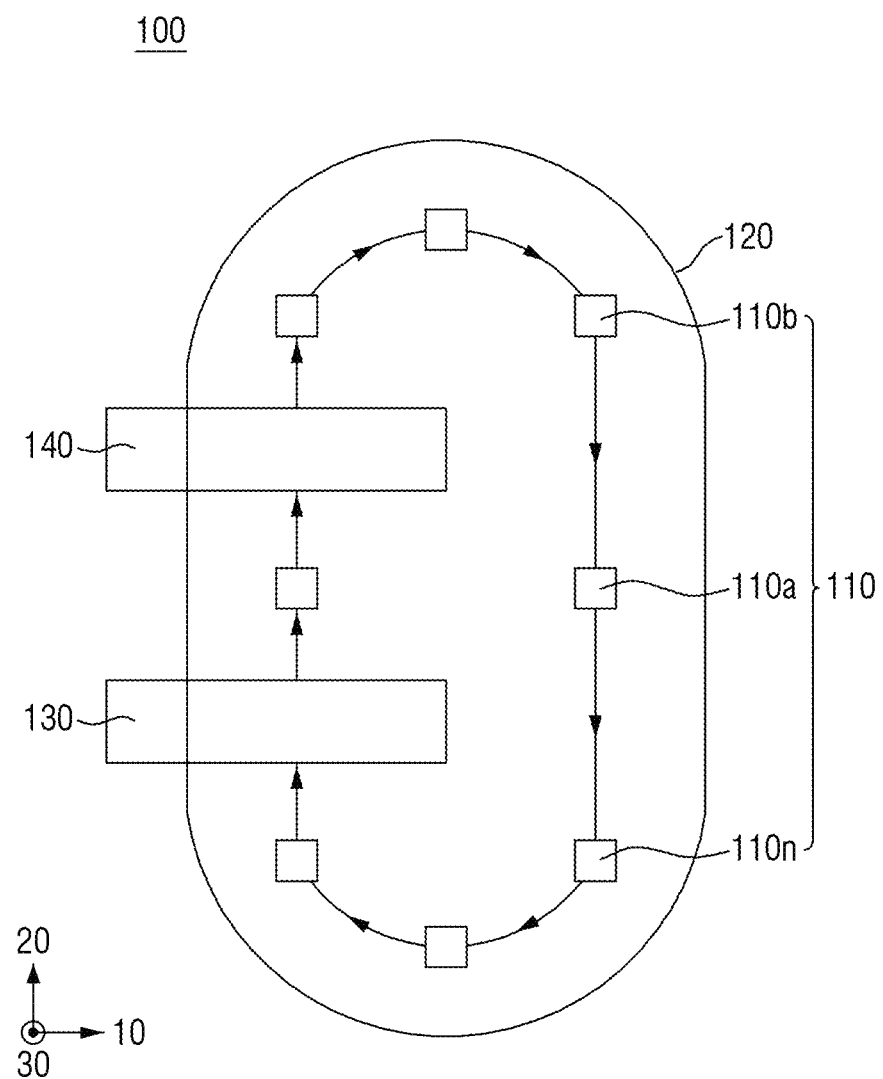

[FIG. 8]
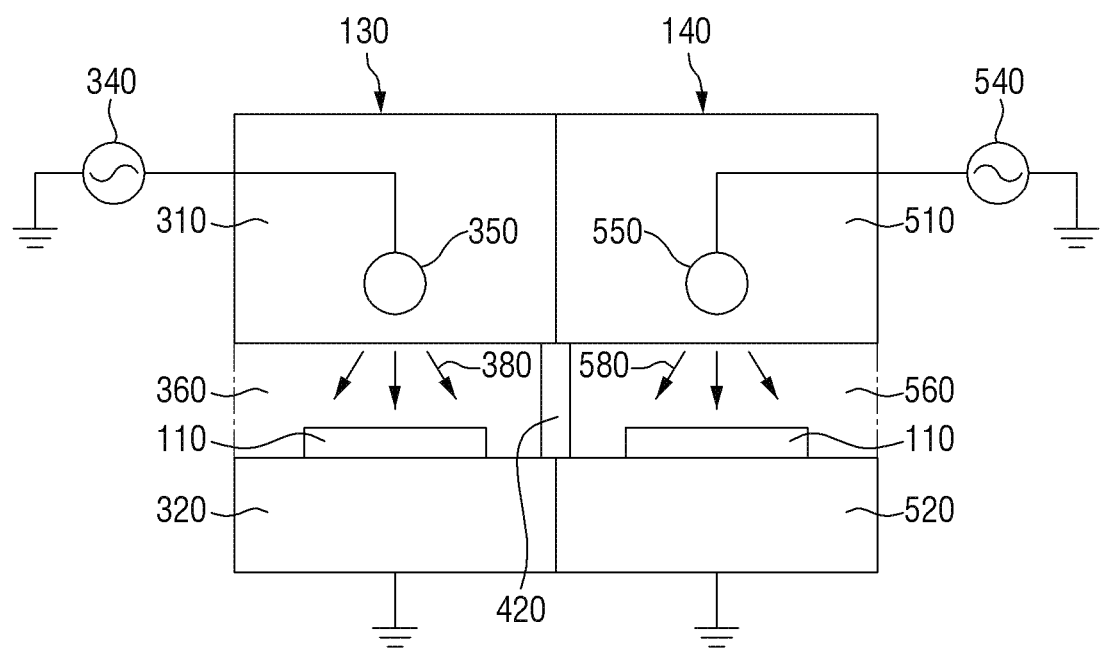

[FIG. 9]
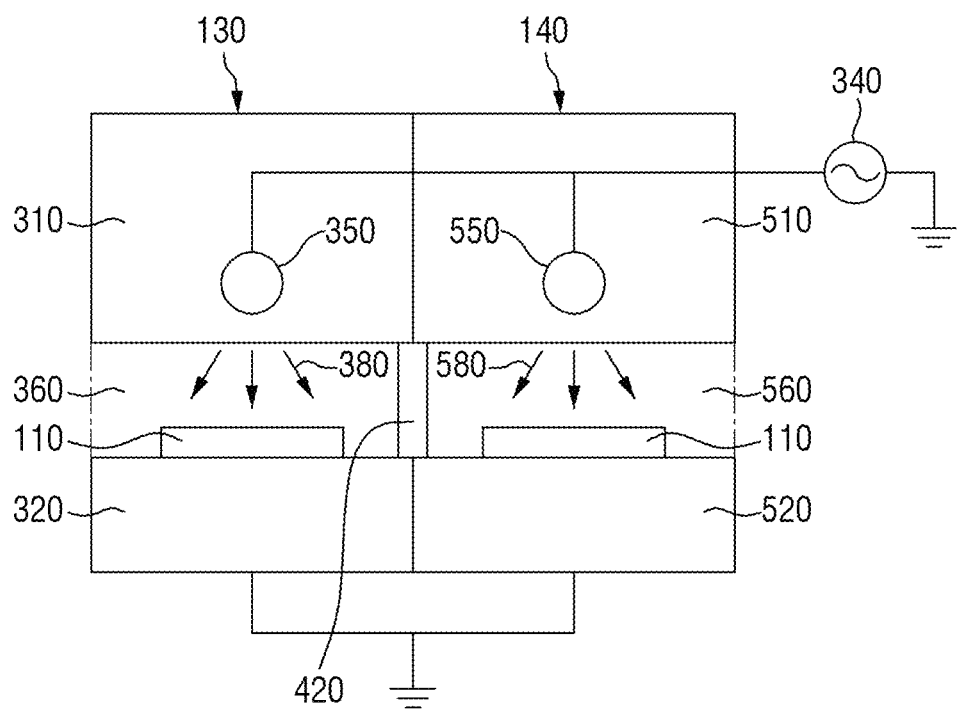

[FIG. 10]
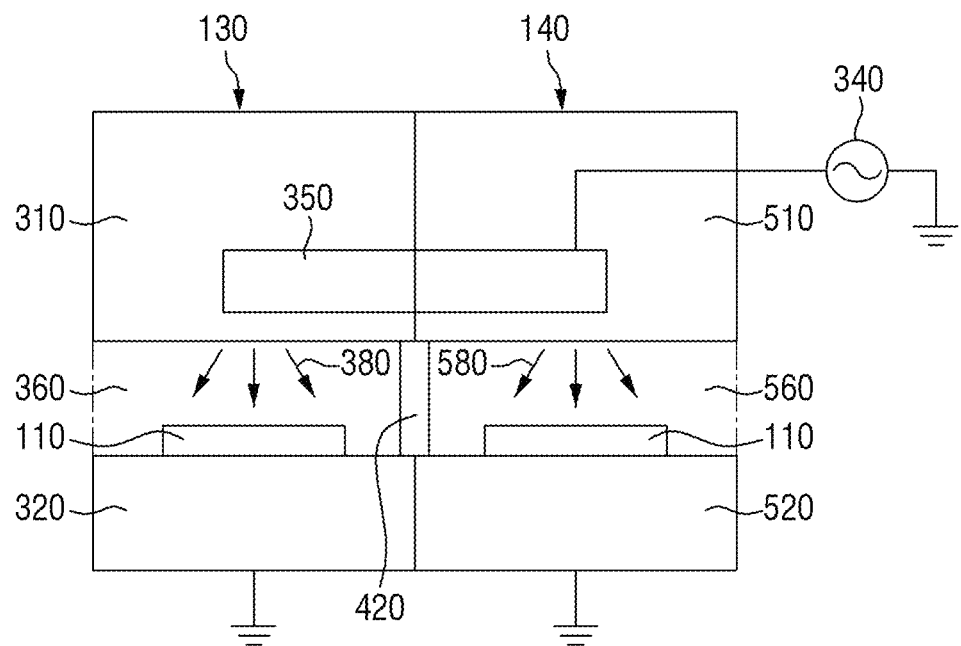

[FIG. 11]
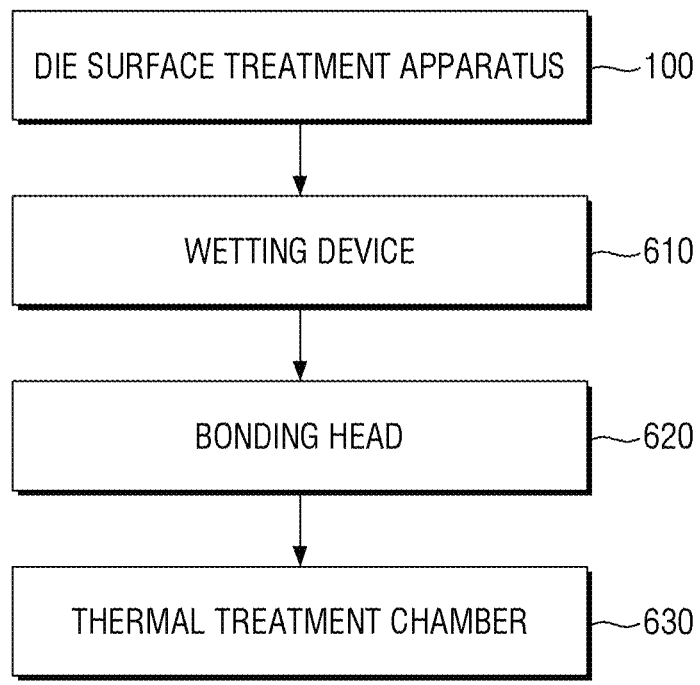

[FIG. 12]
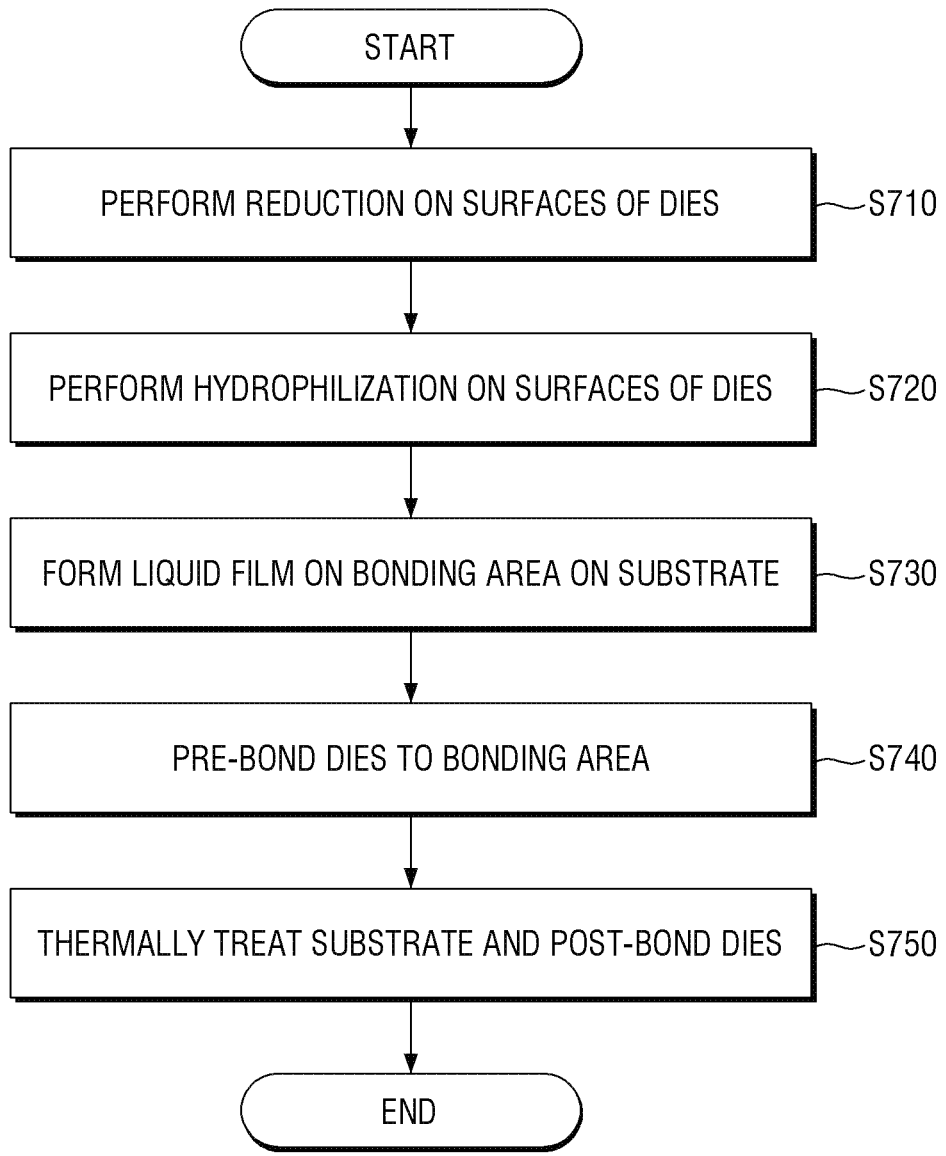

DIE SURFACE TREATMENT APPARATUS AND DIE BONDING SYSTEM INCLUDING THE SAME

BACKGROUND

1. Field

The present disclosure relates to a die surface treatment apparatus and a system including the apparatus, and more particularly, to a die surface treatment apparatus for die bonding and a system including the die surface treatment apparatus.

2. Description of the Related Art

Processes of fabricating a semiconductor device may be continuously performed in a semiconductor manufacturing facility and may be classified into preprocesses and postprocesses. The semiconductor manufacturing facility may be installed in a fabrication space (or a fab space) for manufacturing a semiconductor device.

The preprocesses refer to processes for completing a chip by forming a circuit pattern on a wafer. The preprocesses may include a deposition process that forms a thin film on the wafer, a photolithography process that transfers a photoresist pattern onto the thin film using a photo mask, an etching process that selectively removes any unnecessary parts using a chemical or a reactive gas to form a desired circuit pattern on the wafer, an ashing process that removes parts of the photoresist pattern that remain after the etching process, an ion implantation process that implants ions into parts connected to the circuit pattern to impart the characteristics of an electronic device, and a cleaning process that removes any contamination sources from the wafer.

The postprocesses refer to processes of evaluating the performance of a product obtained by the preprocesses. The postprocesses may include a wafer inspection process that tests each chip on a wafer to determine whether they are bad or good, a packaging process that cuts and separates each chip into a proper product shape through dicing, die bonding, wire bonding, molding or marking, and a final inspection process that finally inspects each chip for their characteristics and reliability through electrical testing or burn-in testing.

Meanwhile, direct bonding generally uses vacuum plasma for surface activation. In this case, however, the amount of tack time for each process may increase, and equipment such as a vacuum chamber and a pump is needed, which means high processing cost and the necessity of large space.

Also, metal layers exposed on the surface of a die may undesirably be oxidized by an $O_2$ gas in vacuum plasma for use in surface activation.

SUMMARY

Aspects of the present disclosure provide a die surface treatment apparatus capable of sequentially performing reduction and activation processes on a die in a dual zone and a die bonding system including the die surface treatment apparatus.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a die surface treatment apparatus comprising: a stage supporting dies; a first plasma generator installed on a moving path of the dies, the first plasma generator performing a reduction process on surfaces of the dies, in a first plasma area; and a second plasma generator installed on the moving path of the dies, the second plasma generator performing a hydrophilization process on the surfaces of the dies, in a second plasma area.

The first plasma generator may perform the reduction process on the surfaces of the dies by using a first processing gas, and the first processing gas may include an inert gas and a reducing gas.

An amount of the inert gas included in the first processing gas may be greater than an amount of the reducing gas included in the first processing gas.

The inert gas may include at least one of $H_2$ and $NH_3$.

The second plasma generator may perform the hydrophilization process on the surfaces of the dies by using a second processing gas, and the second processing gas may include an inert gas.

The stage may rotate in at least one direction, and as the stage rotates, the dies may sequentially pass through the first and second plasma areas.

The dies may rotate in at least one direction, on the stage, and sequentially pass through the first and second plasma areas while rotating on the stage.

The dies may pass through the first plasma area first and then the second plasma area.

The first and second plasma areas may be formed in a shared region and are separated from each other by a barrier.

The barrier may be formed of at least one of a metal and ceramic.

The first and second plasma generators may simultaneously generate different types of plasmas in the first and second plasma areas, respectively, by using an integral electrode.

The first plasma generator may include a first body, which is disposed above the first plasma area, a second body, which is disposed below the first plasma area, a first gas supply module, which supplies a first processing gas into the first plasma area by using a first transfer passage formed in the first body, and a first electrode, which is installed in the first body and excites the first processing gas in response to power being applied thereto.

The second plasma generator may include a third body, which is disposed above the second plasma area, a fourth body, which is disposed below the second plasma area, a second gas supply module, which supplies a second processing gas into the second plasma area by using a second transfer passage formed in the third body, and a second electrode, which is installed in the third body and excites the second processing gas in response to power being applied thereto.

The first and second plasma generators may be installed on the stage to be adjacent to each other in a width direction or to be apart from each other in a length direction.

The first and second plasma generators may alternately treat the surfaces of the dies repeatedly.

Each of the dies may include a substrate layer, a metal layer, which is formed on the substrate layer, an insulating layer, which is formed on the same surface of the substrate layer as the metal layer, vias, which are formed to penetrate the substrate layer and are filled with a metal, and barrier layers, which are formed between the substrate layer and the vias, in the substrate layer.

The first and second plasma generators may treat the surfaces of the dies by using atmospheric plasma.

The die surface treatment apparatus may be used in a direct bonding process.

According to another aspect of the present disclosure, there is provided a die surface treatment apparatus comprising: a stage supporting dies, the stage rotating in at least one direction; a first plasma generator installed on a moving path of the dies, the first plasma generator performing a reduction process on surfaces of the dies, in a first plasma area; and a second plasma generator installed on the moving path of the dies, the second plasma generator performing a hydrophilization process on the surfaces of the dies, in a second plasma area, wherein the first and second plasma generators are installed on the stage to be adjacent to each other in a width direction, and as the stage rotates, the dies are surface-treated alternately in the first and second plasma areas.

According to another aspect of the present disclosure, there is provided a die bonding system comprising: a die surface treatment apparatus performing reduction and hydrophilization processes on surfaces of dies; a wetting device forming a liquid film in an area on a substrate where the dies are to be bonded; a bonding head pre-bonding the dies onto the substrate by placing bonding surfaces of the dies in contact with the liquid film on the substrate; and a thermal treatment chamber thermally treating the substrate before the post-bonding of the dies, wherein the die surface treatment apparatus includes a stage, which supports the dies, a first plasma generator, which is installed on a moving path of the dies and performs a reduction process on surfaces of the dies, in a first plasma area, and a second plasma generator, which is installed on the moving path of the dies and performs a hydrophilization process on the surfaces of the dies, in a second plasma area.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a plan view of a die surface treatment apparatus according to an embodiment of the present disclosure;

FIG. 2 is a side view of a die to be surface-treated by the die surface treatment apparatus of FIG. 1;

FIG. 3 is a plan view of a die surface treatment apparatus according to another embodiment of the present disclosure;

FIG. 4 is a side cross-sectional view of a first plasma generator of FIG. 1;

FIG. 5 illustrates first examples of the first plasma generator and a second plasma generator of FIG. 1;

FIG. 6 illustrates second examples of the first and second plasma generators of FIG. 1;

FIG. 7 is a plan view of a die surface treatment apparatus according to another embodiment of the present disclosure;

FIG. 8 illustrates third examples of the first and second plasma generators of FIG. 1;

FIG. 9 illustrates fourth examples of the first and second plasma generators of FIG. 1;

FIG. 10 illustrates fifth examples of the first and second plasma generators of FIG. 1;

FIG. 11 illustrates the inner structure of a die bonding system including a die surface treatment apparatus, according to an embodiment of the present disclosure; and FIG. 12 is a flowchart illustrating a die bonding method of the die bonding system of FIG. 11.

DETAILED DESCRIPTION

Embodiments of the present disclosure will hereinafter be described with reference to the accompanying drawings. Advantages and features of the present disclosure and a method of achieving the same should become clear with embodiments described in detail below with reference to the accompanying drawings. However, the present disclosure is not limited to the embodiments disclosed below and may be realized in various other forms. The present embodiments make the disclosure complete and are provided to completely inform one of ordinary skill in the art to which the present disclosure pertains of the scope of the disclosure. The present disclosure is defined only by the scope of the claims. Like reference numerals refer to like elements throughout.

It will be understood that when an element or layer is referred to as being "on" another element or layer, it can be directly on the other element or layer or intervening elements or layers may be present therebetween. In contrast, when an element or layer is referred to as being "directly on" another element or layer, there are no intervening elements or layers present.

Spatially-relative terms such as "below", "beneath", "lower", "above" or "upper" may be used herein to describe one element's relationship to another element as illustrated in the accompanying drawings. It will be understood that spatially-relative terms are intended to encompass different orientations of the device in addition to the orientation depicted in the drawings. For example, if the device in one of the drawings is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users.

Embodiments of the present disclosure will hereinafter be described with reference to the accompanying drawings. Like reference numerals indicate like elements through the present disclosure, and thus, detailed descriptions thereof will be omitted.

The present disclosure provides a die surface treatment apparatus for direct bonding, which is characterized by sequentially performing reduction and activation processes on a die in a dual zone.

FIG. 1 is a plan view of a die surface treatment apparatus according to an embodiment of the present disclosure.

Referring to FIG. 1, a die surface treatment apparatus 100 may include dies 110, a stage 120, a first plasma generator 130, and a second plasma generator 140.

The dies 110 may be for die bonding. The dies 110 may be processed by a direct bonding process such as, for example, a direct hybrid bonding process.

The surfaces of the dies 110 may be treated before direct bonding. The die surface treatment apparatus 100, which is for treating the surfaces of the dies 110, may treat the surfaces of the dies 110 with, for example, plasma.

In a case where the dies 110 are implemented as a samples for direct hybrid bonding, each of the dies 110 may have a structure as illustrated in FIG. 2.

FIG. 2 is a side view of a die to be surface-treated by the die surface treatment apparatus of FIG. 1.

Referring to FIG. 2, each of the dies 110 may be formed to include a substrate layer 210, a metal layer 220, and a dielectric layer 230. The substrate layer 210 may be formed mainly of a silicon (Si) material, but the present disclosure is not limited thereto.

The metal layer 220 and the dielectric layer 230 are formed on the substrate layer 210. The metal layer 220 may be formed on one surface of the substrate 210, and the insulating layer 230 may be formed on both surfaces of the substrate layer 210. However, the present disclosure is not limited to this. The metal layer 220 may also be formed on both surfaces of the substrate layer 210.

In a case where the metal layer 220 is formed on one surface of the substrate layer 210, the metal layer 220 may be formed only in a particular area on the substrate layer 210, and the insulating layer 230 may be formed in other areas on the substrate layer 210. The metal layer 220 may be, for example, a redistribution layer (RDL).

Each of the dies 110 may include vias 240, which are formed to penetrate the substrate layer 210 for forming circuitry. More than one via 240 may be provided in each of the dies 110.

The vias 240 may be filled with a metal. The vias 240 may be filled with, for example, copper (Cu).

Each of the dies 110 may further include barrier layers 250 between the substrate layer 210 and the vias 240 to prevent the metal that the vias 240 are filled with from infiltrating into the substrate layer 210.

Each of the dies 110 may be formed by stacking multiple chips via micro-bump bonding. In this case, a plurality of dies 110a through 110n may be provided as through silicon via (TSV) dies. However, the present disclosure is not limited to this. Alternatively, each of the dies 110 may be formed by stacking multiple chips via wire bonding.

Referring again to FIG. 1, the stage 120 supports the dies 110, which are mounted on the stage 120. The stage 120 may support the plurality of dies 110a through 110n, but the present disclosure is not limited thereto. Alternatively, the stage 120 may support only one die 110.

The stage 120 may be configured to be rotatable. The stage 120 may be configured to be rotatable clockwise or counterclockwise. In a case where the stage 120 is implemented as a rotation stage, the plurality of dies 110a through 110n may be placed on the stage 120 to sequentially pass through the first and second plasma generators 130 and 140. In this case, the plurality of dies 110a through 110n may be installed to be fixed on the stage 120.

Alternatively, as illustrated in FIG. 3, the stage 120 may be fixed, and the plurality of dies 110a through 110n may be installed on the stage to be rotatable. In this case, the plurality of dies 110a through 110n may also be configured to sequentially pass through the first and second plasma generators 130 and 140, on the stage 120. FIG. 3 is a plan view of a die surface treatment apparatus according to another embodiment of the present disclosure.

The plurality of dies 110a through 110n may be installed on the stage 120 to be rotatable in only one direction, i.e., either clockwise or counterclockwise, but the present disclosure is not limited thereto. Alternatively, the plurality of dies 110a through 110n may be installed on the stage 120 to be rotatable in both directions, i.e., clockwise and counter-clockwise.

Referring again to FIG. 1, the stage 120 may be configured to have a circular shape in a cross-sectional view taken along a first direction 10, but the present disclosure is not limited thereto. The stage 120 may be configured to have an elliptical or polygonal shape in a cross-sectional view taken along the first direction 10. For example, as illustrated in FIG. 3, the stage 120 may be configured to have a rectangular shape in a cross-sectional view taken along the first direction 10.

FIG. 1 illustrates that the stage 120 is configured to have a circular shape and to be rotatable, but the present disclosure is not limited thereto. Alternatively, the stage 120 may be configured to have a circular shape, but to be rotatable, as illustrated in FIG. 3. Yet alternatively, the stage 120 may be configured to have various other shapes than a circular shape, but not to be rotatable.

The first plasma generator 130 is installed on the moving path of the dies 110. The first plasma generator 130 may perform surface treatment on bonding surfaces of the dies 110, using atmospheric (AP) plasma. The first plasma generator 130 may be implemented as an AP plasma electrode.

The first plasma generator 130 performs a reduction process on the surfaces of the dies 110, using AT plasma. To this end, the first plasma generator 130 may include a first body 310, a second body 320, a first gas supply module 330, a first power supply module 340, and a first electrode 350.

FIG. 4 is a side cross-sectional view of the first plasma generator of FIG. 1.

Referring to FIG. 4, the first and second bodies 310 and 320 may be disposed above and below a first plasma area 360. To generate plasma, the first electrode 350 may be provided in the first body 310, and the second body 320 may be grounded. The first and second bodies 310 and 320 may be formed as insulators.

The first gas supply module 330 supplies a first processing gas 380 to the first plasma area 360. The first plasma area 360 refers to an area where plasma for reduction is generated.

As described above, the first plasma generator 130 may perform a reduction process on the surfaces of the dies 110. The first gas supply module 330 may provide the mixture of an inert gas and a reduction gas as the first processing gas 380.

The first processing gas 380 may be the mixture of an inert gas and a reduction gas. Here, argon (Ar) may be used as the inert gas, and hydrogen ($H_2$) or ammonia ($NH_3$) may be used as the reduction gas.

In the first processing gas 380, the inert gas may be mixed at a higher ratio than the reduction gas. For example, the inert gas may be present at a ratio of 0.3% or less in the first processing gas 380.

The first processing gas 380 may be transferred into the first plasma area 360 through a first transfer passage 370, which is formed in the first body 310.

The first power supply module 340 applies radio frequency (RF) power to the first electrode 350. The first power supply module 340 may apply RF power to the first electrode 350 when the first processing gas 380 is supplied to the first plasma area 360 through the first transfer passage 370.

The first electrode 350 excites the first processing gas 380 being transferred to the first plasma area 360, with the RF power applied by the first power supply module 340. The first processing gas 380 may be excited by the first electrode 350 to plasma-treat the surfaces of the dies 110, in the first plasma area 360.

Referring again to FIG. 1, the second plasma generator 140, like the first plasma generator 130, is installed on the moving path of the dies 110. The second plasma generator 140 may also perform surface treatment on the bonding surfaces of the dies 110, using AP plasma. The second plasma generator 140, like the first plasma generator 130, may be implemented as an AP plasma electrode.

The first and second plasma generators 130 and 140 may be integrally formed into a single module, as illustrated in FIG. 5.

FIG. 5 illustrates first examples of the first plasma generator and a second plasma generator of FIG. 1.

Referring to FIG. 5, the first and second plasma generators 130 and 140 may share a region 410 formed in one module. A barrier 420 is installed in the shared region 410 so that the shared region 410 can be divided into first and second plasma areas 360 and 560. The first plasma area 360 may refer to an area where plasma for reduction is generated, and the second plasma area 560 may refer to an area where hydrophilic plasma is generated.

The barrier 420 may allow the shared region 410 to be dual zone including the first and second plasma areas 360 and 560. The barrier 420 may be formed of a metal or ceramic.

The first and second plasma generators 130 and 140 may be implemented as separate modules, as illustrated in FIG. 6. FIG. 6 illustrates second examples of the first and second plasma generators of FIG. 1.

In a case where the first and second plasma generators 130 and 140 are integrally formed into a single module, as illustrated in FIG. 5, the first and second plasma generators 130 and 140 may be installed on the stage 120 to be adjacent to each other in a width direction (or the first direction 10).

The first and second plasma generators 130 and 140 may be installed on the stage 120 to have, for example, a structure as illustrated in FIG. 1 or 3.

However, the present disclosure is not limited to this. Alternatively, in a case where the first and second plasma generators 130 and 140 are implemented as separate modules, the first and second plasma generators 130 and 140 may be installed on the stage 120 to be apart from each other in a length direction (or a second direction 20), as illustrated in FIG. 6. The first and second plasma generators 130 and 140 may be installed on the stage 120 to have, for example, a structure as illustrated in FIG. 7. FIG. 7 is a plan view of a die surface treatment apparatus according to another embodiment of the present disclosure.

Referring again to FIG. 1, the second plasma generator 140 may perform an activation (or hydrophilization) process on the surfaces of the dies 110, using AP plasma. The second plasma generator 140 may be installed to have the first plasma generator 130 of FIG. 4.

The structure of the second plasma generator 140 will hereinafter be described with reference to FIG. 4.

Referring to FIG. 4, the second plasm generator 140 may include a third body 510, a fourth body 520, a second gas supply module, a second power supply module, and a second electrode. The third body 510, the fourth body 520, and the second plasma area 560 may be as illustrated in FIGS. 5 and 6.

The third and fourth bodies 510 and 520 may correspond to the first and second bodies 310 and 320, respectively. That is, the third body 310 may be formed to have the same structure as the first body 310, and the fourth body 520 may be formed to have the same structure as the second body 320.

The second gas supply module supplies a second processing gas into the second plasma area 560. The second gas supply module may be formed to have the same structure as the first gas supply module 330.

As already mentioned above, the second plasma generator 140 may perform an activation (or hydrophilization) process on the surfaces of the dies 110. The second gas supply module may supply an inert gas as the second processing gas. The second gas supply module may supply, for example, Ar, as the second processing gas.

The second processing gas may be transferred into the second plasma area 560 through a second transfer passage, which is formed in the third body 510. The second transfer passage may be formed to have the same structure as the first transfer passage 370.

The second power supply module applies RF power to the second electrode. The second power supply module and the second electrode may be formed to have the same structure as the first power supply module 340 and the first electrode 350, respectively.

The second electrode excites the second processing gas being transferred to the second plasma area 560, with the RF power applied by the second power supply module. The second processing gas may be excited by the second electrode to plasma-treat the surfaces of the dies 110, in the second plasma area 560.

Referring to FIG. 8, the first and second plasma generators 130 and 140 may excite their respective processing gases, using their respective power supply modules and electrodes. Specifically, the first plasma generator 130 may excite the first processing gas 380 using the first power supply module 340 and the first electrode 350, and the second plasma generator 140 may excite a second processing gas 580 using a second power supply module 540 and a second electrode 550. FIG. 8 illustrates third examples of the first and second plasma generators of FIG. 1.

In the embodiment of FIG. 8, the first and second plasma generators 130 and 140 may excite the first and second processing gases 380 and 580, respectively, under different voltage conditions.

However, the present disclosure is not limited to this. Alternatively, referring to FIG. 9, the first and second plasma generators 130 and 140 may excite the first and second processing gases 380 and 580, respectively, using a single power supply module 450 to apply power to the first and second electrodes 350 and 550, respectively. In this case, the first and second plasma generators 130 and 140 may excite the first and second processing gases 380 and 580, respectively, under the same voltage condition. FIG. 9 illustrates fourth examples of the first and second plasma generators of FIG. 1.

The electrodes of the first and second plasma generators 130 and 140 may be integrally formed into a single electrode 350, as illustrated in FIG. 10. In this case, two types of AP plasmas may be formed at the same time by injecting a reducing gas to one end of the electrode 350 and injecting a gas for activation to the other end of the electrode 350. FIG. 10 illustrates fifth examples of the first and second plasma generators of FIG. 1.

The first and second plasma generators 130 and 140 have been described above with reference to FIGS. 1 and 4 through 10. The first and second plasma generators 130 and 140 may perform surface treatment on the bonding surfaces of the dies 110 by exciting a processing gas into a plasma state.

The first plasma generator 130 may perform reduction on the surfaces of the dies 110, and then, the second plasma generator 140 may perform activation (or hydrophilization) on the surfaces of the dies 110.

If the second plasma generator 140 performs activation (or hydrophilization) on the surfaces of the dies 110 first, metal layers 220 exposed on the surfaces of the dies 110 may be oxidized. To prevent this, the surfaces of the dies 110 may be reduced first and then activated (or hydrophilized).

The dies 110 may be surface-treated once by each of the first and second plasma generators 130 and 140, but the present disclosure is not limited thereto. Alternatively, the dies 110 may be surface-treated more than once by each of the first and second plasma generators 130 and 140.

The number of times that the dies 110 are surface-treated by the first plasma generator 130 may be the same as the number of times that the dies 110 are surface-treated by the second plasma generator 140. For example, the dies 110 may be surface-treated twice by the first plasma generator 130 and twice by the second plasma generator 140.

However, the present disclosure is not limited to this. Alternatively, the number of times that the dies 110 are surface-treated by the first plasma generator 130 may differ from the number of times that the dies 110 are surface-treated by the second plasma generator 140. For example, the dies 110 may be surface-treated three times by the first plasma generator 130 and four times by the second plasma generator 140.

The die surface treatment apparatus 100 has been described with reference to FIGS. 1 through 10. The die surface treatment apparatus 100 may treat the surfaces of the dies 110, using an AP plasma electrode in a dual zone. The AP plasma electrode is characterized by simultaneously performing reduction and hydrophilization (or activation) on the surfaces of samples during a direct hybrid bonding process.

The die surface treatment apparatus 100 may include an AP plasma electrode, from which plasma for reduction and plasma for hydrophilization (or activation) are ejected at the same time to configure a dual zone. The die surface treatment apparatus 100 can sequentially perform reduction and activation (or hydrophilization) processes on the surfaces of samples by using the AP plasma electrode for a dual zone, thereby performing a reduction process on a metallic surface on a substrate for direct hybrid bonding and then an activation (or hydrophilization) process on a dielectric surface on the substrate. Also, the die surface treatment apparatus 100 can perform reduction and activation processes sequentially and repeatedly on samples by using a rotation stage. Also, the die surface treatment apparatus 100 can perform an AP plasma process at a lower cost than when using a vacuum plasma and can minimize the layout for module configuration.

A die bonding method of a die bonding system 600 will hereinafter be described.

FIG. 11 illustrates the inner structure of a die bonding system including a die surface treatment apparatus, according to an embodiment of the present disclosure. FIG. 12 is a flowchart illustrating a die bonding method of the die bonding system of FIG. 11.

Referring to FIGS. 11 and 12, the first plasma generator 130 of the die surface treatment apparatus 100 performs a reduction process on the surfaces of the dies 110 (S710). The die surface treatment apparatus 100 may perform a reduction process (e.g., Ar/$H_2$ AP plasma treatment) on the surfaces of the dies 110 by using the first processing gas 380, which is the mixture of an inert gas and a reducing gas, and as a result, the metal layers 220 on the surfaces of the dies 110 may be reduced.

Thereafter, the second plasma generator 140 of the die surface treatment apparatus 100 performs an activation (or hydrophilization) process on the surfaces of the dies 110 (S720). The die surface treatment apparatus 100 may perform an activation (or hydrophilization) process (e.g., Ar AP plasma treatment) on the surfaces of the dies 110 by using the second processing gas 580, which consists of an inert gas, and as a result, the insulating layers 230 on the surfaces of the dies 110 may be activated (or hydrophilized).

Thereafter, a wetting device 610 of the die bonding system 600 forms a liquid film by supplying a liquid to a bonding area on a substrate where the dies 110 are to be bonded (S730). Here, the liquid may be deionized water (DIW).

Thereafter, a bonding head 620 of the die bonding system 600 places the bonding surfaces of the dies 110 in contact with the liquid film on the substrate. Then, due to the bonding force between the hydrophilized bonding surfaces of the dies 110 and the liquid film, the dies 110 may be pre-bonded onto the substrate (S740) without the need to pressurize the dies 110 or increase the temperature.

Thereafter, once the dies 110 are pre-bonded onto the substrate, the substrate is transferred to a thermal treatment chamber 630 and is then annealed, and the dies 110 are simultaneously post-bonded onto the substrate (S750).

Although the present disclosure has been described above in relation to the above-mentioned exemplary embodiments thereof, the present disclosure may be modified or changed in various ways without departing from the gist and scope of the disclosure. Therefore, such modifications or changes belong to the scope of the attached claims as long as the modifications or changes belong to the gist of the present disclosure.

What is claimed is:

1. A die surface treatment apparatus comprising:
   a stage supporting dies;
   a first plasma generator installed on a moving path of the dies, the first plasma generator performing a reduction process on surfaces of the dies, in a first plasma area;
   a second plasma generator installed on the moving path of the dies, the second plasma generator performing a hydrophilization process on the surfaces of the dies, in a second plasma area; and
   an integral electrode disposed in the first plasma generator and the second plasma generator, the integral electrode configured to simultaneously generate different types of plasmas in the first and second plasma areas, respectively,
   wherein the stage rotates in at least one direction, and as the stage rotates, the dies sequentially pass through the first and second plasma areas.

2. The die surface treatment apparatus of claim 1, wherein
   the first plasma generator performs the reduction process on the surfaces of the dies by using a first processing gas, and
   the first processing gas includes an inert gas and a reducing gas.

3. The die surface treatment apparatus of claim 2, wherein an amount of the inert gas included in the first processing gas is greater than an amount of the reducing gas included in the first processing gas.

4. The die surface treatment apparatus of claim 2, wherein the processing gas includes $H_2$ or $NH_3$.

5. The die surface treatment apparatus of claim 1, wherein
   the second plasma generator performs the hydrophilization process on the surfaces of the dies by using a second processing gas, and
   the second processing gas includes an inert gas.

6. The die surface treatment apparatus of claim 1, wherein the dies rotate in at least one direction, on the stage, and sequentially pass through the first and second plasma areas while rotating on the stage.

7. The die surface treatment apparatus of claim 1, wherein the dies pass through the first plasma area first and then the second plasma area.

8. The die surface treatment apparatus of claim 1, wherein the first and second plasma areas are formed in a shared region and are separated from each other by a barrier.

9. The die surface treatment apparatus of claim 8, wherein the barrier is formed of at least one of a metal and ceramic.

10. The die surface treatment apparatus of claim 1, wherein:
    the first plasma generator includes a first body, which is disposed above the first plasma area, a second body, which is disposed below the first plasma area, and a first gas supply module, which supplies a first processing gas into the first plasma area by using a first transfer passage formed in the first body, and
    the integral electrode is configured to excite the first processing gas in response to power being applied thereto.

11. The die surface treatment apparatus of claim 1, wherein the second plasma generator includes a third body, which is disposed above the second plasma area, a fourth body, which is disposed below the second plasma area, a second gas supply module, which supplies a second processing gas into the second plasma area by using a second transfer passage formed in the third body, and a second electrode, which is installed in the third body and excites the second processing gas in response to power being applied thereto.

12. The die surface treatment apparatus of claim 1, wherein the first and second plasma generators are installed on the stage to be adjacent to each other in a width direction or to be apart from each other in a length direction.

13. The die surface treatment apparatus of claim 1, wherein the first and second plasma generators alternately treat the surfaces of the dies repeatedly.

14. The die surface treatment apparatus of claim 1, wherein each of the dies includes a substrate layer, a metal layer, which is formed on the substrate layer, an insulating layer, which is formed on the same surface of the substrate layer as the metal layer, vias, which are formed to penetrate the substrate layer and are filled with a metal, and barrier layers, which are formed between the substrate layer and the vias, in the substrate layer.

15. The die surface treatment apparatus of claim 1, wherein the first and second plasma generators treat the surfaces of the dies by using atmospheric plasma.

16. The die surface treatment apparatus of claim 1, wherein the die surface treatment apparatus is used in a direct bonding process.

17. A die surface treatment apparatus comprising:
    a stage supporting dies, the stage rotating in at least one direction;
    a first plasma generator installed on a moving path of the dies, the first plasma generator performing a reduction process on surfaces of the dies, in a first plasma area;
    a second plasma generator installed on the moving path of the dies, the second plasma generator performing a hydrophilization process on the surfaces of the dies, in a second plasma area; and
    an integral electrode disposed in the first plasma generator and the second plasma generator, the integral electrode configured to simultaneously generate different types of plasmas in the first and second plasma areas, respectively,
    wherein
    the first and second plasma generators are installed on the stage to be adjacent to each other in a width direction, and
    as the stage rotates, the dies are surface-treated alternately in the first and second plasma areas.

18. A die bonding system comprising:
    a die surface treatment apparatus performing reduction and hydrophilization processes on surfaces of dies;
    a wetting device forming a liquid film in an area on a substrate where the dies are to be bonded;
    a bonding head pre-bonding the dies onto the substrate by placing bonding surfaces of the dies in contact with the liquid film on the substrate; and
    a thermal treatment chamber thermally treating the substrate before post-bonding of the dies,
    wherein the die surface treatment apparatus includes a stage, which supports the dies, a first plasma generator, which is installed on a moving path of the dies and performs a reduction process on surfaces of the dies, in a first plasma area, a second plasma generator, which is installed on the moving path of the dies and performs a hydrophilization process on the surfaces of the dies, in a second plasma area, and an integral electrode disposed in the first plasma generator and the second plasma generator, the integral electrode configured to simultaneously generate different types of plasmas in the first and second plasma areas, respectively, and wherein the stage rotates in at least one direction, and as the stage rotates, the dies sequentially pass through the first and second plasma areas.

\* \* \* \* \*